(12) United States Patent
Masuda

(10) Patent No.: US 10,926,642 B2
(45) Date of Patent: Feb. 23, 2021

(54) ELECTRIC VEHICLE

(71) Applicant: Toyota Jidosha Kabushiki Kaisha, Toyota (JP)

(72) Inventor: Tomokazu Masuda, Kasugai (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 70 days.

(21) Appl. No.: 16/255,294

(22) Filed: Jan. 23, 2019

(65) Prior Publication Data

US 2019/0225088 A1 Jul. 25, 2019

(30) Foreign Application Priority Data

Jan. 25, 2018 (JP) ................. 2018-010821

(51) Int. Cl.
| | | |
|---|---|---|
| *B60L 3/12* | (2006.01) | |
| *H02J 7/00* | (2006.01) | |
| *G01R 31/00* | (2006.01) | |
| *B60L 53/00* | (2019.01) | |
| *H02H 3/00* | (2006.01) | |

(Continued)

(52) U.S. Cl.
CPC ............... *B60L 3/12* (2013.01); *B60L 3/0069* (2013.01); *B60L 53/00* (2019.02); *G01R 31/006* (2013.01); *H02H 3/00* (2013.01); *H02J 7/0029* (2013.01); *H02J 7/0031* (2013.01); *H02P 27/06* (2013.01); *H02P 2201/09* (2013.01); *Y02T 10/64* (2013.01); *Y02T 10/70* (2013.01); *Y02T 90/16* (2013.01)

(58) Field of Classification Search
CPC .......... H02J 7/00; H02J 7/0031; H02J 7/0029; B60L 11/18; B60L 3/00; B60L 3/12; B60L 15/20; B60L 3/0069; B60L 53/00; H02H 3/16; H02H 3/00; H01M 10/44; H01M 10/48; H02P 27/06; H02P 2201/09; H02P 27/08; G01R 31/006; Y02T 90/14; Y02T 10/70; Y02T 90/16; Y02T 10/64; Y02T 10/7072
USPC ........ 307/10.1, 147; 320/109, 107; 324/503, 324/512, 522, 500, 535; 361/91.5
See application file for complete search history.

(56) References Cited

U.S. PATENT DOCUMENTS 9,696,743 B1 * 7/2017 Treichler .................. G05F 3/02
2004/0243288 A1 12/2004 Kito et al.

FOREIGN PATENT DOCUMENTS

| JP | 2004-354247 A | 12/2004 |
|---|---|---|
| JP | 2011-015530 A | 1/2011 |
| JP | 2016-201937 A | 12/2016 |

* cited by examiner

*Primary Examiner* — Arnold M Kinkead
(74) *Attorney, Agent, or Firm* — Dinsmore & Shohl LLP

(57) ABSTRACT

An electric vehicle includes an electrical storage device, a charging device that charges the electrical storage device when connected to the external power supply device, a ground fault detection device including a ground fault detection circuit and configured to detect a ground fault while the electrical storage device is being charged, and a controller that carries out communication with the external power supply device and carries out communication with the ground fault detection device. The controller acquires a common-mode noise margin of the external power supply device and transmits a ground fault detection time based on the common-mode noise margin to the ground fault detection device. The ground fault detection device detects a ground fault when the ground fault detection time has elapsed from when the ground fault detection circuit is set to a state where a ground fault is detectable.

5 Claims, 3 Drawing Sheets

(51) Int. Cl.
*H02P 27/06* (2006.01)
*B60L 3/00* (2019.01)

ELECTRIC VEHICLE

CROSS-REFERENCE TO RELATED APPLICATION

This application claims priority to Japanese Patent Application No. 2018-010821 filed on Jan. 25, 2018, incorporated herein by reference in its entirety.

BACKGROUND

1. Technical Field

The disclosure relates to an electric vehicle and, more specifically, to an electric vehicle including a ground fault detection device that detects a ground fault while an electrical storage device is connected to an external power supply device and is being charged by a charging device.

2. Description of Related Art

An electric vehicle equipped with a charging device that charges a battery, or the like, when connected to a commercial AC power supply has been suggested as an electric vehicle of this type (see, for example, Japanese Patent Application Publication No. 2011-015530 (JP 2011-015530 A)). The charging device mounted on this electric vehicle has a ground fault detection unit. The ground fault detection unit detects a ground fault during charging. The ground fault detection unit includes a noise filter. Common-mode noise that is generated by a load is removed by the noise filter.

SUMMARY

However, the charging device mounted on the above-described electric vehicle may not be able to properly detect a ground fault during charging due to the influence of common-mode noise of an external power supply device. When a capacitor is used as a ground fault detection circuit that detects a ground fault during charging and a ground fault is detected based on the voltage of the capacitor after a lapse of a predetermined time from the start of charging of the capacitor, a variation in the voltage of the capacitor depends on the common-mode noise margin of the external power supply device. For this reason, when the predetermined time is set in accordance with the large common-mode noise margin of the external power supply device, a ground fault may be erroneously detected when the common-mode noise margin is small; whereas, when the predetermined time is set in accordance with the small common-mode noise margin of the external power supply device, a ground fault may be erroneously detected when the common-mode noise margin is large.

The disclosure provides an electric vehicle that further properly detects a ground fault in accordance with the common-mode noise margin of an external power supply device.

An aspect of the disclosure relates to an electric vehicle. The electric vehicle includes an electric motor, an electrical storage device, a charging device, a ground fault detection device, and a controller. The electric motor is configured to input or output power for propelling the electric vehicle. The electrical storage device is configured to exchange electric power with the electric motor. The charging device is configured to charge the electrical storage device when connected to an external power supply device. The ground fault detection device includes a ground fault detection circuit for detecting a ground fault in a charging system. The ground fault detection device is configured to detect a ground fault while the electrical storage device is being charged by the charging device. The controller is configured to carry out communication with the external power supply device and carry out communication with the ground fault detection device. The controller is configured to acquire a common-mode noise margin of the external power supply device. The controller is configured to transmit a ground fault detection time based on the common-mode noise margin of the external power supply device to the ground fault detection device. The ground fault detection device is configured to detect a ground fault when the ground fault detection time has elapsed from when the ground fault detection circuit is set to a state where a ground fault is detectable.

The electric vehicle according to the aspect of the disclosure includes an electric motor configured to input or output power for propelling the electric vehicle, an electrical storage device configured to exchange electric power with the electric motor, a charging device configured to charge the electrical storage device when connected to an external power supply device, a ground fault detection device including a ground fault detection circuit for detecting a ground fault in a charging system and configured to detect a ground fault while the electrical storage device is being charged by the charging device, and a controller configured to carry out communication with the external power supply device and carry out communication with the ground fault detection device. The controller is configured to acquire a common-mode noise margin of the external power supply device. The controller is configured to transmit a ground fault detection time based on the common-mode noise margin of the external power supply device to the ground fault detection device. The ground fault detection device is configured to detect a ground fault when the ground fault detection time has elapsed from when the ground fault detection circuit is set to a state where a ground fault is detectable. Thus, it is possible to further properly detect a ground fault based on a common-mode noise margin of the external power supply device.

In the electric vehicle according to the aspect of the disclosure, the ground fault detection circuit may include a capacitor, and the ground fault detection device may be configured to detect a ground fault based on a voltage of the capacitor at the time when the ground fault detection time has elapsed from when the ground fault detection circuit is set to the state where a ground fault is detectable. With this configuration, it is possible to detect a ground fault with a simple configuration. In this case, the controller may be configured to set the ground fault detection time to a time that is taken from when the ground fault detection circuit is set to the state where a ground fault is detectable to when a difference between the voltage of the capacitor at the time when there is no ground fault and the voltage of the capacitor at the time when there is a ground fault is maximum, and transmit the ground fault detection time to the ground fault detection device. With this configuration, it is possible to further properly detect a ground fault.

In the electric vehicle according to the aspect of the disclosure, the controller may be configured to acquire an identifier of the external power supply device through communication, and the controller may be configured to acquire the common-mode noise margin of the external power supply device based on the identifier. With this configuration, it is possible to acquire a proper common-mode noise margin of each individual external power supply device, so it is possible to further properly detect a ground fault.

In the electric vehicle according to the aspect of the disclosure, the controller may be configured to transmit the shorter ground fault detection time as the common-mode noise margin reduces. This is based on the fact that a change between when there is no ground fault and when there is a ground fault increases as the common-mode noise margin of an external power supply device reduces. With this configuration, it is possible to further properly detect a ground fault.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION

Next, an embodiment of the disclosure will be described.

Figure 1:
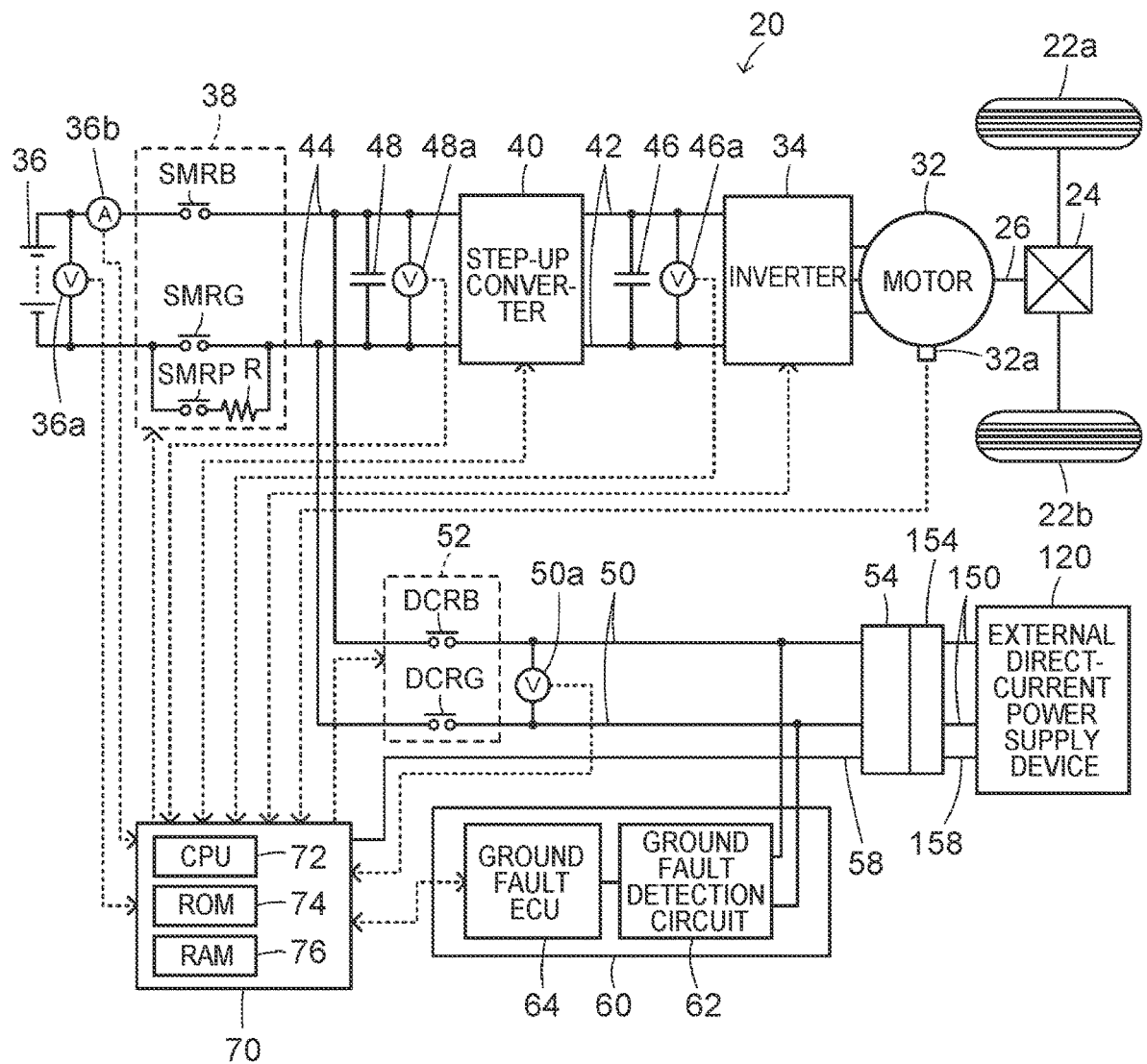
FIG. 1 is a block diagram that schematically shows the configuration of an electric-powered vehicle that is one embodiment of the disclosure.

FIG. 1 is a block diagram that schematically shows the configuration of an electric-powered vehicle 20 that is one embodiment of the disclosure. As shown in the drawing, the electric-powered vehicle 20 of the embodiment includes a motor 32, an inverter 34, a battery 36, a step-up converter 40, a high-voltage power line 42, a low-voltage power line 44, a system main relay 38, a charging power line 50, a ground fault detection device 60, and an electronic control unit 70.

The motor 32 is configured as a synchronous generator-motor. The motor 32 includes a rotor and a stator. Permanent magnets are embedded in the rotor. Three-phase coils are wound on the stator. The rotor of the motor 32 is connected to a drive shaft 26. The drive shaft 26 is coupled to drive wheels 22a, 22b via a differential gear 24.

The inverter 34 is connected to the motor 32, and is also connected to the high-voltage power line 42. The inverter 34 is configured as a known inverter circuit including six transistors and six diodes.

The battery 36 is configured as, for example, a lithium ion secondary battery or a nickel-metal hydride secondary battery. The battery 36 is connected to the low-voltage power line 44.

The step-up converter 40 is connected to the high-voltage power line 42 and the low-voltage power line 44. The step-up converter 40 is configured as a known step-up/step-down converter circuit including two transistors, two diodes, and a reactor.

A high-voltage capacitor 46 is connected to the positive electrode bus and negative electrode bus of the high-voltage power line 42. A low-voltage capacitor 48 is connected to the positive electrode bus and negative electrode bus of the low-voltage power line 44. The system main relay 38 is provided in the low-voltage power line 44. The system main relay 38 includes a positive electrode relay SMRB, a negative electrode relay SMRG, and a precharge circuit. The positive electrode relay SMRB is provided in the positive electrode bus of the low-voltage power line 44. The negative electrode relay SMRG is provided in the negative electrode bus of the low-voltage power line 44. The precharge circuit includes a precharge resistor R and a precharge relay SMRP that are connected in series with each other so as to bypass the negative electrode relay SMRG.

One end of the charging power line 50 is connected to the low-voltage power line 44 on the step-up converter 40 side (motor 32 side) of the system main relay 38. The other end of the charging power line 50 is connected to a vehicle-side inlet 54. A charging relay 52 is provided in the charging power line 50. The charging relay 52 includes a positive electrode relay DCRB and a negative electrode relay DCRB. The positive electrode relay DCRB is provided in the positive electrode line of the charging power line 50. The negative electrode relay DCRB is provided in the negative electrode line of the charging power line 50. The charging power line 50 is connected to an external charging power line 150 extending from an external direct-current power supply device 120 when an external connector 154 of the external direct-current power supply device 120 is connected to the vehicle-side inlet 54. Although not shown in the drawing, the external direct-current power supply device 120 is connected to an external commercial power supply. The external direct-current power supply device 120 converts electric power from the commercial power supply to direct-current power, and supplies the direct-current power through the external charging power line 150.

Figure 2:
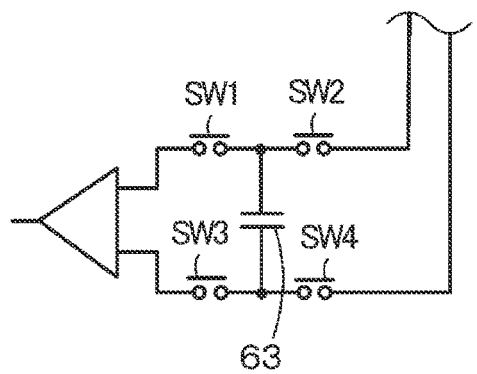
FIG. 2 is a diagram that shows an example of a ground fault detection circuit.

The ground fault detection device 60 includes a ground fault detection circuit 62 and a ground fault electronic control unit (hereinafter, referred to as ground fault ECU) 64. The ground fault detection circuit 62 is connected to the charging power line 50. The ground fault ECU 64 controls the ground fault detection circuit 62. As shown in FIG. 2, the ground fault detection circuit 62, for example, includes four switches SW1, SW2, SW3, SW4, and a capacitor 63. One terminal of the switch SW2 is connected to the positive electrode line of the charging power line 50. The other terminal of the switch SW2 is connected to the switch SW1. The other end of the switch SW1 is grounded via an insulating resistor (not shown). One terminal of the switch SW4 is connected to the negative electrode line of the charging power line. The other terminal of the switch SW4 is connected to the switch SW3. The other end of the switch SW3 is grounded via an insulating resistor (not shown). The capacitor 63 is connected to a connection point between the switches SW1, SW2 and is also connected to a connection point between the switches SW3, SW4. In the ground fault detection circuit 62 illustrated in FIG. 2, when a ground fault at the positive electrode line side of the charging power line 50 is detected, the switches SW1, SW4 are turned off, and the switches SW2, SW3 are turned on. When a ground fault at the negative electrode line side of the charging power line 50 is detected, the switches SW1, SW4 are turned on, and the switches SW2, SW3 are turned off. Detection of a ground fault is performed by detecting the voltage of the capacitor 63 after a lapse of a ground fault detection time from when the ground fault detection circuit 62 is set to a switch state where a ground fault is detectable. The voltage of the capacitor 63 at the time when there is a ground fault increases more quickly than the voltage of the capacitor 63 at the time when there is no ground fault. Therefore, when a time that is taken until a large difference between the voltage of the capacitor 63 at the time when there is a ground fault and the voltage of the capacitor 63 at the time when there is no ground fault is used as a ground fault detection time, it is possible to detect a ground fault based on the voltage of the capacitor 63.

The electronic control unit 70 is a microprocessor that mainly includes a CPU 72. Other than the CPU 72, the electronic control unit 70 includes a ROM 74, a RAM 76, a flash memory (not shown), input/output ports (not shown), a communication port (not shown), and the like. The ROM 74 stores processing programs. The RAM 76 temporarily stores data.

Signals from various sensors are input to the electronic control unit 70 via the input port. Examples of the signals that are input to the electronic control unit 70 include a rotational position θm, a voltage VB, a current IB, a voltage VH of the high-voltage capacitor 46 (high-voltage power line 42), a voltage VL of the low-voltage capacitor 48 (low-voltage power line 44), and a charging voltage Vchg. The rotational position θm is input from a rotational position detection sensor (for example, resolver) 32a. The rotational position detection sensor 32a detects the rotational position of the rotor of the motor 32. The voltage VB is input from a voltage sensor 36a. The voltage sensor 36a is connected between the terminals of the battery 36. The current IB is input from a current sensor 36b. The current sensor 36b is connected to the output terminal of the battery 36. The voltage VH of the high-voltage capacitor 46 is input from a voltage sensor 46a. The voltage sensor 46a is connected between the terminals of the high-voltage capacitor 46. The voltage VL of the low-voltage capacitor 48 is input from a voltage sensor 48a. The voltage sensor 48a is connected between the terminals of the low-voltage capacitor 48. The charging voltage Vchg is input from a voltage sensor 50a. The voltage sensor 50a is connected to the charging power line 50. The electronic control unit 70 also functions as a drive controller for a vehicle, so information required for running control is also input to the electronic control unit 70. Although not shown in the drawing, examples of these pieces of information include an ignition signal, a shift position, an accelerator operation amount, a brake pedal position, and a vehicle speed. The ignition signal is input from an ignition switch. The shift position is input from a shift position sensor. The shift position sensor detects the operating position of a shift lever. The accelerator operation amount is input from an accelerator pedal position sensor. The accelerator pedal position sensor detects the depression amount of an accelerator pedal. The brake pedal position is input from a brake pedal position sensor. The brake pedal position sensor detects the depression amount of a brake pedal. The vehicle speed is input from a vehicle speed sensor.

Various control signals are output from the electronic control unit 70 via the output port. Examples of the signals that are output from the electronic control unit 70 include switching control signals to the transistors of the inverter 34, switching control signals to the transistors of the step-up converter 40, a drive control signal to the system main relay 38, and a drive control signal to the charging relay 52.

The electronic control unit 70 is connected to the ground fault ECU 64 via the communication port. The electronic control unit 70 exchanges information with the ground fault ECU 64. When a communication line 58 connected to the communication port is connected to an external communication line 158 via the vehicle-side inlet 54 and the external connector 154, the electronic control unit 70 carries out communication with the external direct-current power supply device 120.

Figure 3:
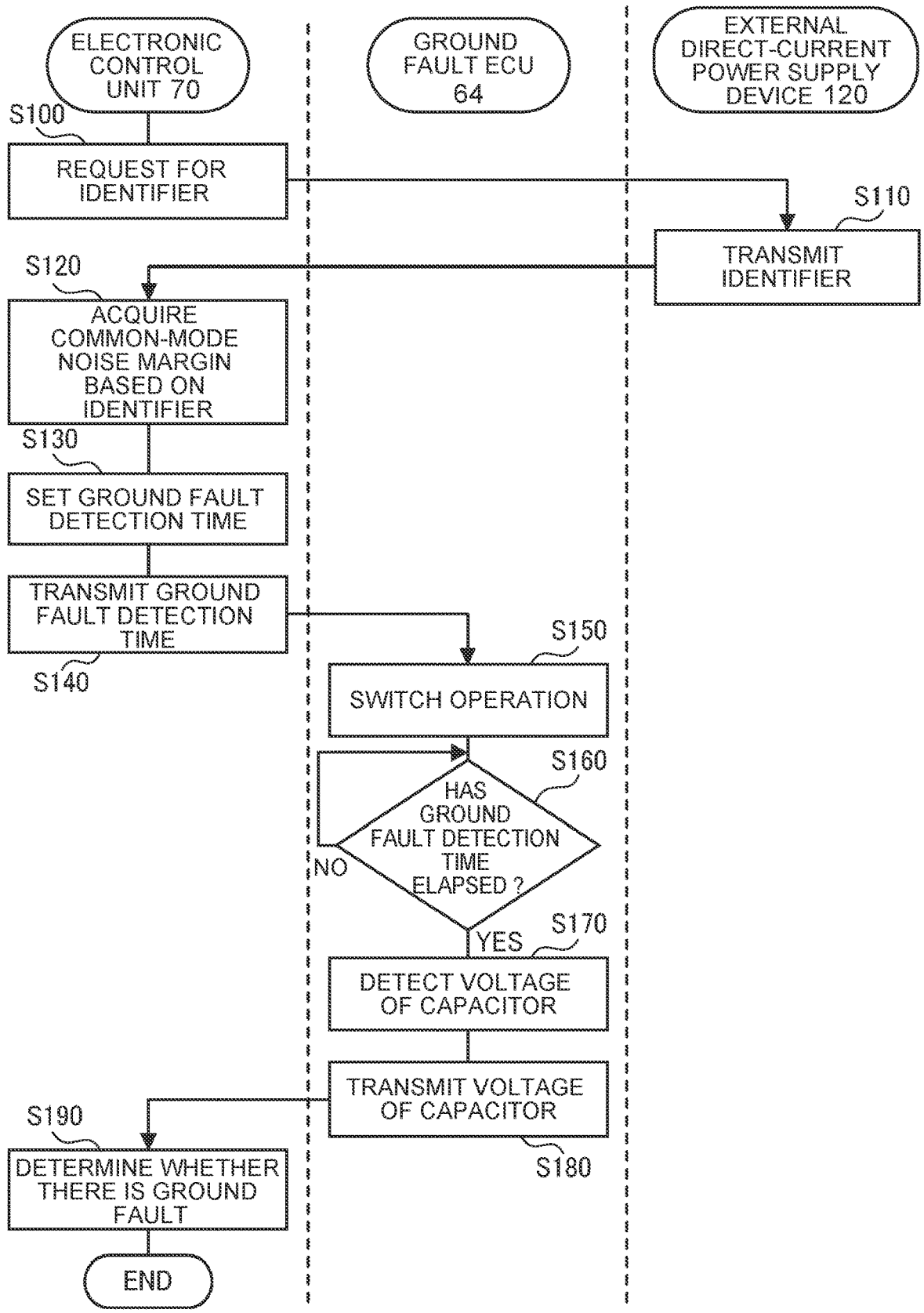
FIG. 3 is a flowchart that illustrates an example of the operations of an electronic control unit, ground fault ECU, and external direct-current power supply device at the time of detecting a ground fault.

Next, the operation of the thus configured electric-powered vehicle 20 of the embodiment, particularly, the operation of the electric-powered vehicle 20 at the time of detecting a ground fault while the battery 36 is being charged with electric power from the external direct-current power supply device 120, will be described. FIG. 3 is a flowchart that illustrates an example of the operations of the electronic control unit 70, ground fault ECU 64, and external direct-current power supply device 120 at the time of detecting a ground fault.

In detecting a ground fault, initially, the electronic control unit 70 requires the external direct-current power supply device 120 to transmit an identifier (step S100). In response to the request, the external direct-current power supply device 120 transmits its own identifier to the electronic control unit 70 (step S110). As the electronic control unit 70 receives the identifier of the external direct-current power supply device 120, the electronic control unit 70 acquires the common-mode noise margin of the external direct-current power supply device 120 based on the identifier (step S120). In the embodiment, in acquiring the common-mode noise margin, a relation between identifier and common-mode noise margin is obtained in advance and is stored as a margin setting table, and then the common-mode noise margin is acquired by applying the identifier to the margin setting table.

Figure 4:
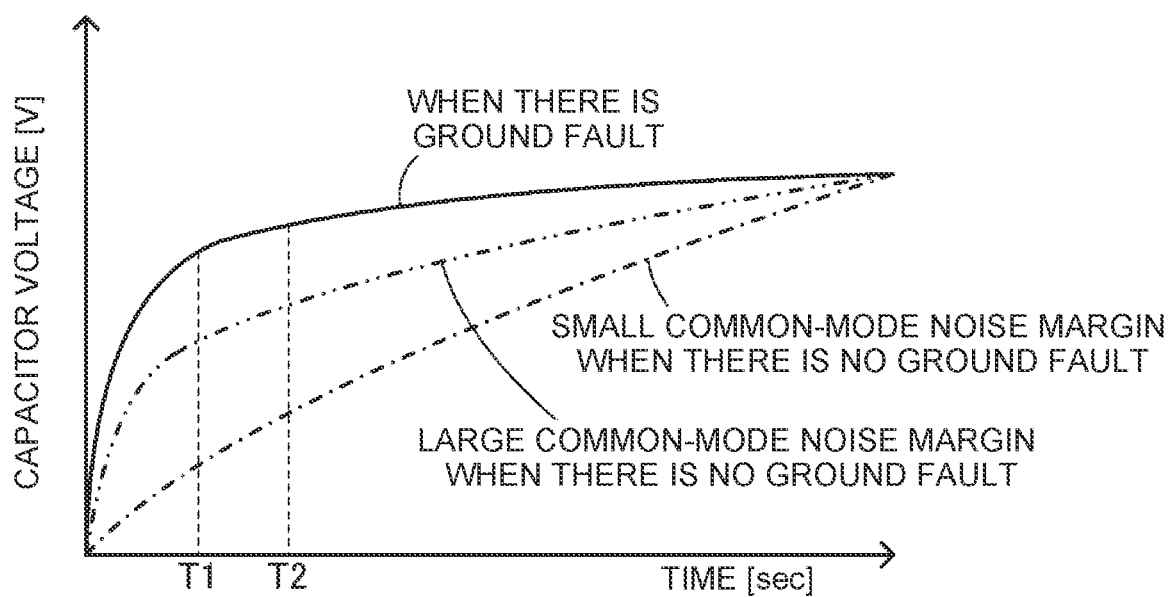
FIG. 4 is a graph that shows an example of a time change in the voltage of a capacitor of the ground fault detection circuit based on whether there is a ground fault and the common-mode noise margin of the external direct-current power supply device.

Subsequently, the electronic control unit 70 sets a ground fault detection time based on the acquired common-mode noise margin (step S130). In the embodiment, the relation between common-mode noise margin and ground fault detection time is set in advance and stored as a ground fault detection time setting table, and then, when a common-mode noise margin is acquired, a ground fault detection time is set by deriving a ground fault detection time from the table. FIG. 4 is a graph that shows an example of a time change in the voltage of the capacitor 63 of the ground fault detection circuit 62 based on whether there is a ground fault and the common-mode noise margin of the external direct-current power supply device 120. In the graph, the continuous line represents a time change in the voltage of the capacitor 63 of the ground fault detection circuit 62 at the time when there is a ground fault. The alternate long and short dash line represents a time change in the voltage of the capacitor 63 of the ground fault detection circuit 62 at the time when there is no ground fault in the case where the common-mode noise margin of the external direct-current power supply device 120 is small. The alternate long and two short dashes line represents a time change in the voltage of the capacitor 63 of the ground fault detection circuit 62 at the time when there is no ground fault in the case where the common-mode noise margin of the external direct-current power supply device 120 is large. Time T1 is the time at which a difference between the voltage of the capacitor 63 at the time when there is a ground fault and the voltage of the capacitor 63 at the time when there is no ground fault in the case where the common-mode noise margin of the external direct-current power supply device 120 is small (a difference between the continuous line and the alternate long and short dash line) is maximum. Time T2 is the time at which a difference between the voltage of the capacitor 63 at the time when there is a ground fault and the voltage of the capacitor 63 at the time when there is no ground fault in the case where the common-mode noise margin of the external direct-current power supply device 120 is large (a difference between the continuous line and the alternate long and two short dashes line) is maximum. As represented by the alternate long and short dash line, the voltage of the capacitor 63 slowly increases when the common-mode noise margin of the external direct-current power supply device 120 is small. As represented by the alternate long and two short dashes line, when the common-mode noise margin of the external direct-current power supply device 120 is large, the voltage of the capacitor 63 quickly increases, and approaches to an increase in the voltage of the capacitor 63 in the case where there is a ground fault. When the common-mode noise margin of the external direct-current power supply device 120 is small, it is possible to determine whether there is a ground fault based on the voltage of the capacitor 63 even before time T1 at which the difference between the voltage of the capacitor 63 at the time when there is no ground fault and the voltage of the capacitor 63 at the time when there is a ground fault is maximum. When the common-mode noise margin of the external direct-current power supply device 120 is large, a ground fault can be erroneously detected unless whether there is a ground fault is determined based on the voltage of the capacitor 63 near time T2 at which the difference between the voltage of the capacitor 63 at the time when there is no ground fault and the voltage of the capacitor 63 at the time when there is a ground fault is maximum. For this reason, in the embodiment, at a value of the common-mode noise margin of the external direct-current power supply device 120, a time that is taken until the difference between the voltage of the capacitor 63 at the time when there is no ground fault and the voltage of the capacitor 63 at the time when there is a ground fault is maximum is set as the ground fault detection time. The ground fault detection time becomes shorter as the common-mode noise margin of the external direct-current power supply device 120 reduces.

As the electronic control unit 70 sets the ground fault detection time, the electronic control unit 70 transmits the set ground fault detection time to the ground fault ECU 64 (step S140). As the ground fault ECU 64 receives the ground fault detection time, the ground fault ECU 64 turns on or off the switches SW1, SW2, SW3, SW4 (step S150). That is, when a ground fault at the positive electrode line side of the charging power line 50 is detected, the switches SW1, SW4 are turned off, and the switches SW2, SW3 are turned on. When a ground fault at the negative electrode line side is detected, the switches SW1, SW4 are turned on, and the switches SW2, SW3 are turned off. After a lapse of the ground fault detection time from when the switch operation is performed (step S160), the ground fault ECU 64 detects the voltage of the capacitor 63 (step S170), and transmits the detected voltage to the electronic control unit 70 (step S180). As the electronic control unit 70 receives the voltage of the capacitor 63, the electronic control unit 70 determines whether there is a ground fault by determining whether the received voltage is a voltage at the time when there is a ground fault (step S190), after which detection of a ground fault is ended.

In the embodiment, by repeating step S150 to step S190, detection of a ground fault at the positive electrode line side of the charging power line 50 during charging and detection of a ground fault at the negative electrode line side of the charging power line 50 during charging are repeated.

In the above-described electric-powered vehicle 20 of the embodiment, when the external connector 154 is connected to the vehicle-side inlet 54 and then the battery 36 is charged with electric power from the external direct-current power supply device 120, the identifier of the external direct-current power supply device 120 is acquired through communication, and the common-mode noise margin of the external direct-current power supply device 120 is acquired based on the acquired identifier. Subsequently, the ground fault detection time is set based on the common-mode noise margin of the external direct-current power supply device 120, and, at the time when the ground fault detection time has elapsed from when the ground fault detection circuit 62 is set to the switch state where a ground fault is detectable, the voltage of the capacitor 63 is detected. By determining whether the detected voltage of the capacitor 63 is a voltage at the time when there is a ground fault, it is determined whether there is a ground fault. In this way, by determining whether there is a ground fault with the use of the ground fault detection time based on the common-mode noise margin of the external direct-current power supply device 120, it is possible to further properly detect a ground fault.

In the electric-powered vehicle 20 of the embodiment, the identifier of the external direct-current power supply device 120 is acquired through communication, and the common-mode noise margin of the external direct-current power supply device 120 is acquired based on the acquired identifier. Alternatively, the external direct-current power supply device 120 may be caused to store its own common-mode noise margin, and the common-mode noise margin may be acquired from the external direct-current power supply device 120 through communication.

In the electric-powered vehicle 20 of the embodiment, the voltage of the capacitor 63, detected by the ground fault ECU 64 at the time when the ground fault detection time has elapsed from when the ground fault detection circuit 62 is set to the switch state where a ground fault is detectable, is transmitted to the electronic control unit 70, and whether there is a ground fault is determined by the electronic control unit 70 based on the voltage of the capacitor 63. Alternatively, whether there is a ground fault may be determined based on the voltage of the capacitor 63, detected by the ground fault ECU 64, and the determined result may be transmitted to the electronic control unit 70.

In the electric-powered vehicle 20 of the embodiment, at a value of the common-mode noise margin of the external direct-current power supply device 120, a time that is taken until the difference between the voltage of the capacitor 63 at the time when there is no ground fault and the voltage of the capacitor 63 at the time when there is a ground fault is maximum is set as the ground fault detection time. Alternatively, the shortest time that is taken until there is a voltage difference to such an extent that a difference between the voltage of the capacitor 63 at the time when there is no ground fault and the voltage of the capacitor 63 at the time when there is a ground fault is sufficiently recognizable may be set as the ground fault detection time.

In the electric-powered vehicle 20 of the embodiment, the battery 36 is used as an electrical storage device; however, the electrical storage device may be any device that is able to be charged, and may be a capacitor, or the like.

In the embodiment, the electric-powered vehicle 20 includes the motor 32. Alternatively, a hybrid vehicle that includes not only the motor 32 but also an engine may be employed.

In the embodiment, the motor 32 may be regarded as electric motor, the battery 36 may be regarded as electrical storage device, the external direct-current power supply device 120 may be regarded as external power supply device, the charging power line 50, the charging relay 52, the vehicle-side inlet 54, and the electronic control unit 70 may be regarded as charging device, the ground fault detection circuit 62 may be regarded as ground fault detection circuit, the ground fault detection device 60 may be regarded as ground fault detection device, and the electronic control unit 70 may be regarded as controller.

The disclosure is described by way of the embodiment; however, the disclosure is not limited to the embodiment. Of course, the disclosure may be implemented in various forms without departing from the scope of the disclosure.

The disclosure is usable in, for example, electric vehicle manufacturing industry.

What is claimed is:

1. An electric vehicle comprising:
   an electric motor configured to input or output power for propelling the electric vehicle;
   an electrical storage device configured to exchange electric power with the electric motor;
   a charging device configured to charge the electrical storage device when connected to an external power supply device;
   a ground fault detection device including a ground fault detection circuit for detecting a ground fault in a charging system, the ground fault detection device being configured to detect the ground fault while the electrical storage device is being charged by the charging device; and
   a controller configured to carry out communication with the external power supply device and carry out communication with the ground fault detection device,
   the controller being configured to acquire a common-mode noise margin of the external power supply device,
   the controller being configured to determine a ground fault detection time based on a predetermined relation between the ground fault detection time and the common-mode noise margin of the external power supply device and transmit the ground fault detection time to the ground fault detection device, and
   the ground fault detection device being configured to detect the ground fault when the ground fault detection time has elapsed from when the ground fault detection circuit is set to a state where the ground fault is detectable.

2. The electric vehicle according to claim 1, wherein:
   the ground fault detection circuit includes a capacitor; and
   the ground fault detection device is configured to detect the ground fault based on a voltage of the capacitor at the time when the ground fault detection time has elapsed from when the ground fault detection circuit is set to the state where the ground fault is detectable.

3. The electric vehicle according to claim 2, wherein the controller is configured to set the ground fault detection time to a time that is taken from when the ground fault detection circuit is set to the state where a ground fault is detectable to when a difference between the voltage of the capacitor at the time when there is no ground fault and the voltage of the capacitor at the time when there is the ground fault is maximum, and transmit the ground fault detection time to the ground fault detection device.

4. The electric vehicle according to claim 1, wherein:
   the controller is configured to acquire an identifier of the external power supply device through communication; and
   the controller is configured to acquire the common-mode noise margin of the external power supply device based on the identifier.

5. The electric vehicle according to claim 1, wherein the controller is configured to transmit a shorter ground fault detection time as the common-mode noise margin reduces.

* * * * *